United States Patent [19]

Yamazaki

[11] Patent Number: 5,302,841
[45] Date of Patent: Apr. 12, 1994

[54] HETEROJUNCTION BIPOLAR TRANSISTOR

[75] Inventor: Toru Yamazaki, Tokyo, Japan

[73] Assignee: NEC Corporation, Japan

[21] Appl. No.: 800,063

[22] Filed: Nov. 27, 1991

[30] Foreign Application Priority Data

Nov. 28, 1990 [JP]  Japan .................................. 2-327918

[51] Int. Cl.$^5$ .................. H01L 31/072; H01L 31/109; H01L 29/06
[52] U.S. Cl. .................................... 257/197; 257/198; 257/616; 257/655; 257/19
[58] Field of Search ................... 257/197, 616, 655, 19, 257/190, 198

[56] References Cited

U.S. PATENT DOCUMENTS 5,177,583  1/1993  Endo et al. .......................... 257/190

FOREIGN PATENT DOCUMENTS 0373832  6/1990  European Pat. Off. ............. 257/19

Primary Examiner—Rolf Hille
Assistant Examiner—Wael Fahmy
Attorney, Agent, or Firm—Laff, Whitesel, Conte, Saret

[57] ABSTRACT

A Si heterojunction bipolar transistor having a SiGe narrow gap base is disclosed, in which the Ge content in the base region is higher in the neighborhood of the base-emitter junction and also in the neighborhood of the base-collector junction as compared to a central portion of the base region, and also in which the Ge concentration distribution in the base region has a slope toward the central portion from the base-emitter and the base-collector region. The Ge content in the neighborhood of the emitter-base junction can be increased up to 30 to 40%, and the emitter-base junction diffusion potential can be greatly reduced. Further, the average Ge content can be held low owing to the slope of the Ge concentration distribution, thus ensuring freedom from dislocation.

7 Claims, 2 Drawing Sheets

HETEROJUNCTION BIPOLAR TRANSISTOR

BACKGROUND OF THE INVENTION (1) Field of the Invention

The present invention relates to a heterojunction bipolar transistor and, more particularly, to a transistor having a SiGe (Silicon germanium) base.

(2) Description of the Related Art

With the advancement of self-alignment techniques and fine processing techniques, the speed of operation of Si (Silicon) bipolar transistors has been increasing. For further increasing the operation speed, there are attempts to improve the amplification factor (current gain) and also reduce the base resistance of the heterojunction bipolar transistor (hereinafter referred to as "HBT") by realizing the HBT with a material based on silicon. Particularly, an HBT with the base thereof using a SiGe layer having a narrow band gap is advantageous from the standpoints of the reduction of the power supply voltage owing to operation at low temperatures and also from its utility for low temperature BiCMOSs.

With the conventional bipolar transistor structure, the impurity concentration of the emitter thereof is higher than that of the base. In such a structure, the base-emitter junction has a greater electron barrier than the hole barrier due to the band gap narrowing. When this transistor is cooled down to a lower temperature, the barrier against electrons becomes greater, thus resulting in the reduction of the current gain $h_{FE}$ and also in the reduction of the cut-off frequency $f_T$. In an HBT structure having a SiGe base, in order to ensure low temperature operation, the impurity concentration of the base region is made higher than that of the emitter region, while setting these impurity concentrations in a range free from freezing-out, for instance, $3 \times 10^{18}$ cm$^{-3}$ or above. Under this condition, the barrier against hole in the base-emitter junction is great, while the barrier against electron therein is small. In addition, with lowering the temperature the band gap difference is increased, so that the $h_{FE}$ is increased and the $f_T$ is no longer reduced. Further, with an HBT with the base thereof constituted by SiGe, which provides a narrower band gap than that of silicon, the barrier against electron in the base-emitter junction is further reduced and, as a result, the $h_{FE}$ is further increased and the emitter-base junction diffusion potential $(V_F)$ is lower as compared to the base of a silicon homo-junction structure.

The reduction of $V_F$ is an important factor for low temperature operation of the BiCMOS gate circuit. FIG. 1 shows a prior art example of such BiCMOS circuit. Referring to FIG. 1, designated at numerals 12 and 13 are NPN bipolar transistors, at 14 is a P-channel MOS transistor, at 15 to 17 are N-channel MOS transistors, at 18 is an input terminal, and at 19 is an output terminal. In this BiCMOS structure, the high level side voltage loss due to the $V_F$ in the bipolar transistor for pull-up and the low level side voltage loss in the bipolar transistor for pull-down, lead to a corresponding amplitude reduction, thus greatly reducing the operation speed of the BiCMOS gate circuit. In order to reduce the power supply voltage and operation temperature of the BiCMOS gate, therefore, reducing $V_F$ of the bipolar transistor concerned is very important for maintaining a high driving capability to the load and a high operation speed of the BiCMOS.

In order that the emitter-base junction diffusion potential $(V_F)$ be as low as possible in the SiGe base, the content of Ge may be increased. However, if the Ge content is increased excessively, it leads to dislocation in the interface between the silicon substrate and the SiGe due to the difference in the lattice constants between Si and Ge. The lattice constant difference between Si and Ge amounts to 4%. Therefore, the thickness of SiGe that can be grown on Si without dislocation is limited, that is, dislocation takes place when a certain critical thickness is exceeded.

FIG. 4 shows the relation between the critical thickness and the Ge content. As is shown, if a band gap shift of 300 mV, for instance, is to be obtained, a Ge content of 30% is necessary. In this case, the critical thickness of the SiGe is 10 nm. This means that the emitter-collector breakdown voltage is 2~3 V, which is below the power supply voltage used. It may be thought to improve the emitter-collector breakdown voltage by increasing the base impurity concentration, for instance, to $5 \times 10^{19}$ cm$^{-3}$ or above. Doing so, however, reduces the base-collector and base-emitter breakdown voltages.

SUMMARY OF THE INVENTION

The present invention aims at overcoming the above mentioned problems existing in the conventional transistors, and it has an object of providing a semiconductor device of a heterojunction bipolar transistor having a SiGe base, which device permits great reduction of the emitter-base junction diffusion potential without possibility of dislocation in the interface between a Si substrate and the SiGe base.

To attain the above object of the invention, there is provided a semiconductor device, which comprises a Si HBT having a SiGe narrow gap base, the Ge content therein being higher in the neighborhood of the base-emitter junction and also in the neighborhood of the base-collector junction as compared to a central portion of the base region, the Ge concentration distribution in the base region having a slope toward the central portion thereof.

According to the basic structure of the invention, the Si HBT comprises a high impurity concentration emitter region constituted by a doped polysilicon layer (also called polycrystalline silicon layer), an epitaxial silicon layer contiguous to the doped polysilicon layer, a SiGe base region contiguous to the epitaxial silicon layer and a collector region contiguous to the SiGe base region.

According to another structure of the invention, the Si HBT further comprises a non-doped SiGe base region intervening between the epitaxial silicon layer and the SiGe base region.

With the semiconductor device according to the invention, the Ge content in the emitter-base junction of the Si HBT can be increased up to 30 to 40%, and the emitter-base junction diffusion potential can be greatly reduced. The average Ge content can be held low owing to the slope of the Ge concentration distribution, thus ensuring freedom from dislocation.

BRIEF DESCRIPTION OF THE DRAWINGS

The above and other objects, features and advantages of the invention will become more apparent from the following description when the same is read with reference to the accompanying drawings, in which.

DETAILED DESCRIPTION OF THE PREFERRED EMBODIMENTS

Now, preferred embodiments of the invention will be described with reference to the attached drawings.

Figure 1:
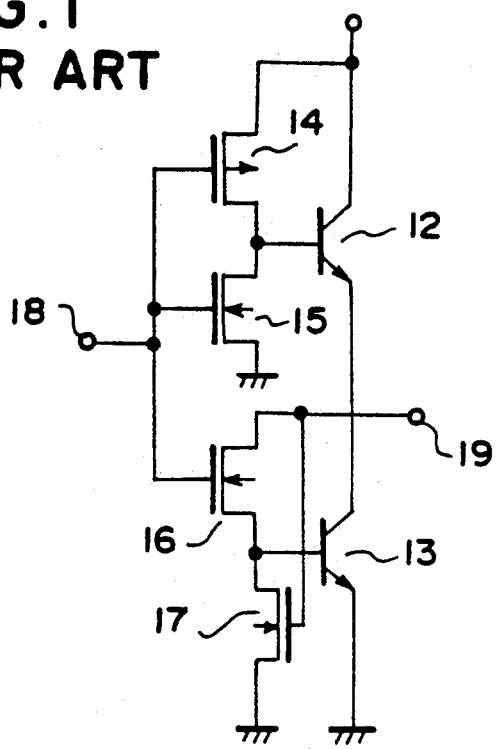
FIG. 1 is a circuit diagram showing a prior art circuit structure.
Figure 2:
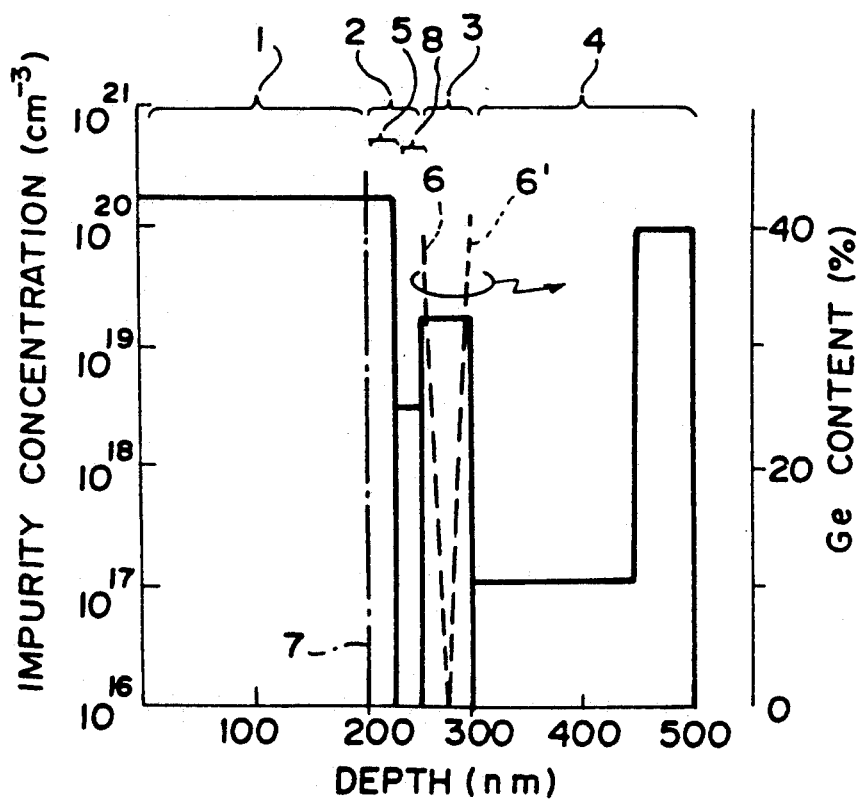
FIG. 2 is a graph showing the impurity concentration and the Ge content, both plotted against the depth direction, in a first embodiment of the invention.

FIG. 2 is a graph showing the impurity concentration and the Ge content, both plotted against the depth direction, in a first embodiment of the invention. Referring to the Figure, designated at a numeral 1 is an uppermost region constituted by a polysilicon layer for emitter electrode. This region has an impurity concentration of $10^{20} \sim 10^{21}$ cm$^{-3}$ and a thickness of 150~250 nm. Designated at a numeral 2 is a region constituted by an epitaxial Si layer with an impurity concentration of $5 \times 10^{17} \sim 1 \times 10^{19}$ cm$^{-3}$ and a thickness of 10~100 nm. Designated at a numeral 3 is a SiGe base region with an impurity concentration of $1 \times 10^{18} \sim 5 \times 10^{19}$ cm$^{-3}$ and a thickness of 10~100 nm. Designated at a numeral 4 is a collector region, which consists of a region with an impurity concentration of $1 \times 10^{16} \sim 6 \times 10^{17}$ cm$^{-3}$ and a buried layer with an impurity concentration of $10^{19} \sim 10^{21}$ cm$^{-3}$. The buried layer is provided for reducing the collector resistance. The region 2 consists of an emitter diffusion layer 5, which is formed by diffusion of an impurity from the polysilicon layer for the emitter electrode, and a low impurity concentration epitaxial Si layer 8. Designated at numerals 6 and 6' is the Ge content in the SiGe base region 3, and designated at a numeral 7 is an interface between the doped polysilicon layer 1 and the epitaxial Si layer 2. In order to suppress the band gap narrowing of the emitter region 2, the impurity concentration thereof is selected to be $5 \times 10^{17} \sim 1 \times 10^{19}$ cm$^{-3}$. If the thickness of the epitaxial Si layer 2 is set to be more than 100 nm, the emitter resistance is increased, which is undesired. Setting the impurity concentration of the emitter region 2 to be more than $1 \times 10^{19}$ cm$^{-3}$, leads to a reduction of the emitter-base breakdown voltage and an increase of the emitter-base capacitance. In the SiGe base region 3, the Ge content is higher in the neighborhood of the base-emitter junction and also in the neighborhood of the base-collector junction as compared to a central portion of the base region itself. In addition, the Ge concentration distribution in the base region 3 has a slope toward the central portion thereof.

The Ge concentration is set to, for instance, 40% in the neighborhood of the base-emitter junction and to 0% in the central portion of the base. By providing such a slope to the Ge concentration distribution in the base region, it is possible to alleviate further the strain in the heterojunction between the Si emitter and the SiGe as compared to the case where the Ge content is uniformly 40% over the entire base region. In addition, with the Ge content of 40% in the neighborhood of the emitter-base junction, the emitter-base junction diffusion potential ($V_F$) is lower than $V_F$ of a homojunction bipolar transistor by about 200 mV. The Ge concentration distribution in the base region is provided with a slope by setting the Ge concentration to 0% in a central portion of the base region and to, for instance, 40% in the neighborhood of the base-collector junction. In this way, the energy gap is reduced from the central portion of the base toward the collector, and thus a sloped Ge concentration distribution base structure utilizing a drift field is formed to increase the speed of motion of carriers in the base. In addition, since the Ge concentration distribution has a slope, the strain in the base-collector heterojunction can be alleviated. Further, with the sloped Ge concentration distribution structure, carriers which have been decelerated by the Ge concentration distribution slope in the neighborhood of the emitter-base junction as noted above is accelerated again. Therefore, the Ge concentration distribution slope as according to the invention never has adverse effects on the transistor characteristics such as cut-off frequency reduction.

Figure 3:
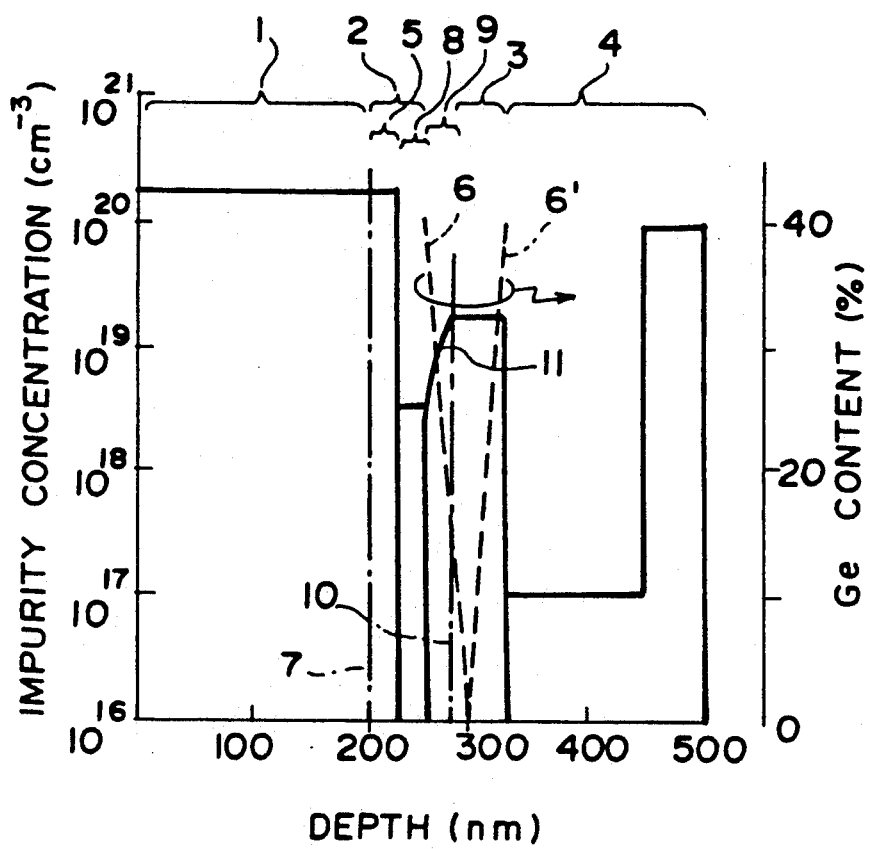
FIG. 3 is a graph showing the impurity concentration and the Ge content, both plotted against the depth direction, in a second embodiment of the invention.
Figure 4:
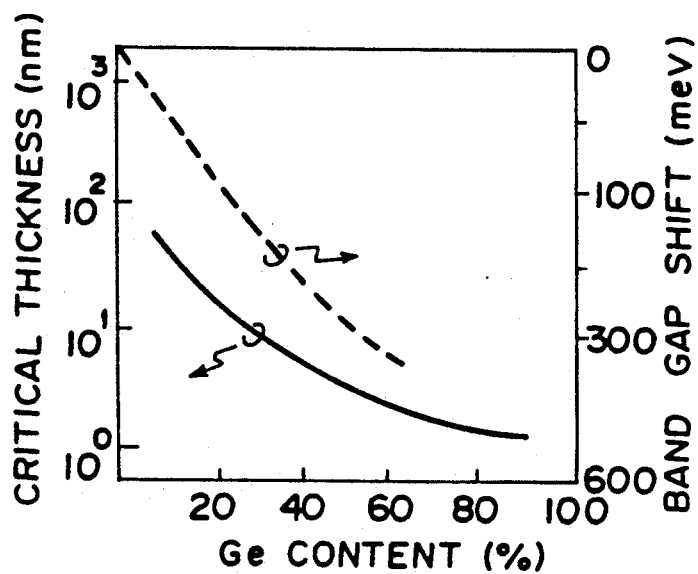
FIG. 4 is a graph showing the relationship among the critical thickness, band gap shift and Ge content.

FIG. 3 is a graph showing the impurity concentration and the Ge content, both plotted against the depth direction, in a second embodiment of the invention. This embodiment is different from the above explained first embodiment in that a non-doped SiGe layer 9 is provided between the epitaxial Si layer, with an impurity concentration of $5 \times 10^{17} \sim 1 \times 10^{19}$ cm$^{-3}$ and a thickness of 10~100 nm, and the SiGe base region 3. The SiGe layer 9 adequately has a thickness of 20~100 Å. This layer 9 is provided for the purpose of a potential barrier increase with respect to electrons. The potential barrier increase might otherwise result from introduction into the epitaxial Si layer 2 of an impurity (for instance, Boron (B)) diffused outwardly from the SiGe base region 3 during heat treatment in the process of manufacture, making the emitter-base junction to be no longer a heterojunction. In FIG. 3, designated at a numeral 10 is an interface between the doped SiGe base and the non-doped SiGe base, and designated at a numeral 11 is the concentration distribution of the base impurity diffused in the non-doped SiGe base region 9. In this second embodiment, the Ge concentration distribution in the SiGe base is sloped from the interface between the non-doped SiGe layer 9 and the epitaxial Si layer 2. With this structure, the strain in the heterojunction can be further alleviated as compared to the previous first embodiment.

As has been described in the foregoing, the Si HBT having a SiGe base according to the invention has a structure that the Ge content in the base is higher in the neighborhood of the base-emitter junction and also in the neighborhood of the base-collector junction as compared to a central portion of the base region, and that the Ge concentration distribution in the base region has a slope toward the central portion thereof. Thus, the Ge content in the emitter-base junction of the Si HBT can be increased up to 30 to 40%, and the emitter-base junction diffusion potential ($V_F$) can be greatly reduced. In addition, the average Ge content can be held low owing to the slope of the Ge concentration distribution, thus ensuring freedom from dislocation.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A semiconductor device comprising a silicon heterojunction bipolar transistor having a base region formed of silicon-germanium (SiGe) with a narrow gap base in which the germanium content of said base is higher in the neighborhood of a base-emitter junction and also in the neighborhood of a base-collector junction as compared to the germanium content in a central portion of the base region, and the germanium concentration distribution in the base region has a slope toward said central portion from said base-emitter junction and from said base-collector junction.

2. The semiconductor device according to claim 1, wherein said silicon heterojunction bipolar transistor includes a high impurity concentration emitter region, an epitaxial silicon layer, a silicon-germanium base region and a collector region, said regions being provided in the order in which they are mentioned.

3. The semiconductor device according to claim 2, wherein said emitter region has an impurity concentration of $10^{20} \sim 10^{21}$ cm$^{-3}$ and a thickness of 150~250 nm; said epitaxial silicon layer has an impurity concentration of $5 \times 10^{17} \sim 1 \times 10^{19}$ cm$^{-3}$ and a thickness of 10~100 nm; said silicon-germanium base region has an impurity concentration of $1 \times 10^{18} \sim 5 \times 10^{19}$ cm$^{-3}$ and a thickness of 10~100 nm; and said collector region includes a region having an impurity concentration of $1 \times 10^{16} \sim 6 \times 10^{17}$ cm$^{-3}$ and a buried layer having an impurity concentration of $10^{19} \sim 10^{21}$ cm$^{-3}$.

4. The semiconductor device according to claim 2, wherein said silicon heterojunction bipolar transistor further includes a non-doped silicon-germanium base region provided between said epitaxial silicon layer and said silicon-germanium base region.

5. The semiconductor device according to claim 4, wherein said non-doped silicon-germanium base region has a thickness of 20 to 100 angstroms.

6. A semiconductor device comprising a silicon heterojunction bipolar transistor having a base formed of silicon-germanium (SiGe) with a narrow gap base in which the germanium content is higher in the neighborhood of a base-emitter junction and also in the neighborhood of a base-collector junction as compared to the germanium content in a central portion of a base region, and the germanium concentration distribution in the base region has a slope from said central portion toward said base-emitter junction and toward said base-collector junction, said germanium concentration distribution being substantially 0% at said central portion of the base region, and the germanium concentration in said central portion of the base region increasing with an equal slope from said central portion toward an emitter and from said central portion toward a collector.

7. The semiconductor device according to claim 6, wherein said germanium concentration distribution toward said central portion of the base region and an impurity concentration distribution toward said central portion of the base region are sloped counter to each other.

* * * * *